United States Patent
Mills et al.

(10) Patent No.: US 6,181,549 B1
(45) Date of Patent: Jan. 30, 2001

(54) CHASSIS RETAINING SYSTEM FOR AN ELECTRONICS RACK

(75) Inventors: R. Steven Mills; Steven L. Sands, both of Austin, TX (US)

(73) Assignee: Dell Products, L.P., Round Rock, TX (US)

(*) Notice: Under 35 U.S.C. 154(b), the term of this patent shall be extended for 0 days.

(21) Appl. No.: 08/881,544

(22) Filed: Jun. 24, 1997

(51) Int. Cl.[7] .................................. G06F 1/16; H05K 7/10
(52) U.S. Cl. .................... 361/683; 361/724; 361/726; 361/801; 292/114; 292/228; 312/223.2; 312/223.3
(58) Field of Search .................... 361/683, 724–727, 361/732, 740, 759, 801; 292/114, 128, 102, 107, 108, 228; 312/332.1, 303, 223.1–223.3

(56) References Cited

U.S. PATENT DOCUMENTS

| | | | |
|---|---|---|---|
| 2,609,268 | * 9/1952 | Nye | 292/229 |
| 2,630,364 | 3/1953 | Gleason | 312/323 |
| 2,676,866 | * 4/1954 | Woodin | 292/229 |
| 2,808,575 | * 10/1957 | Karlson | 292/114 |
| 3,188,524 | * 6/1965 | Williams | 292/114 |
| 3,218,518 | * 11/1965 | Ashbridge et al. | 292/114 |
| 3,656,058 | * 4/1972 | Leathers | 292/114 |
| 4,931,907 | * 6/1990 | Robinson et al. | 361/759 |
| 5,209,356 | * 5/1993 | Chaffee | 361/727 |
| 5,222,897 | * 6/1993 | Collins et al. | 361/759 |
| 5,359,492 | * 10/1994 | Porter | 361/683 |
| 5,379,184 | * 1/1995 | Barraza et al. | 361/685 |
| 5,388,032 | 2/1995 | Gill | 364/146 |
| 5,450,285 | * 9/1995 | Schlemmer | 361/724 |
| 5,460,441 | * 10/1995 | Hastings et al. | 312/223.2 |
| 5,505,533 | 4/1996 | Kammersqard et al. | 312/236 |
| 5,586,003 | 12/1996 | Schmitt | 361/683 |
| 5,612,854 | * 3/1997 | Wiscombe et al. | 361/727 |
| 5,684,671 | * 11/1997 | Hobbs et al. | 361/683 |
| 5,801,921 | * 9/1998 | Miller | 361/686 |
| 5,896,273 | * 4/1999 | Varghese et al. | 361/724 |
| 5,971,506 | * 10/1999 | Dubin | 312/223.2 |

\* cited by examiner

*Primary Examiner*—Leo P. Picard
*Assistant Examiner*—Lisa Lea-Edmonds
(74) *Attorney, Agent, or Firm*—Skjerven, Morrill, MacPherson L.L.P.; Stephen A. Terrile; David G. Dolezal

(57) ABSTRACT

A chassis retaining system for securing a chassis supporting electronic equipment such as a computer system to a rack. The chassis retaining system includes a handle and a securing device with a retaining surface. The securing device is coupled to the handle, and the retaining surface is movable with respect to the handle. The chassis retaining system further includes a user interface device coupled to the handle and to the securing device. The user interface device is movable with respect to the handle. The user interface device is engageable by a user to move the retaining surface from a first position with respect to the handle wherein a surface of the electronics rack in which a chassis is mounted retains the retaining surface, to a second position wherein the surface of the electronics rack does not retain the retaining surface.

28 Claims, 5 Drawing Sheets

CHASSIS RETAINING SYSTEM FOR AN ELECTRONICS RACK

BACKGROUND OF THE INVENTION

1. Field of the Invention

This invention relates to a rack for housing electronic equipment, and more specifically to a chassis retaining system for a rack housing electronic equipment.

2. Description of the Related Art

An electronics rack is an apparatus used to house electronic equipment including telephone equipment and computer systems. One standard for governing the dimensions of an electronics rack and the enclosures for the equipment stored in the rack is the EIA (Electronic Industries Association) standard. These standards allow for electronic equipment to be stored in an efficient and orderly manner.

Electronic equipment is mounted or enclosed in a chassis with attached side rails that allow the chassis to slide into the EIA rack on rails attached to the rack. Fasteners, such as thumb screws (see FIG. 1, item 145), which are accessible from the front of the chassis, are used to secure the chassis to the rack once the chassis is slid into a secured position. Before removing the chassis from the rack, a user first has to unscrew the thumb screws. Consequently, the use of thumb screws adds to the inconvenience of securing and removing the chassis to and from the rack. What is needed is a more convenient way to secure a chassis to an electronics rack.

SUMMARY OF THE INVENTION

It has been discovered that providing a securing device and a user interface device coupled to a handle of a chassis mounted in an electronics rack advantageously provides a more convenient apparatus for securing the chassis to the electronics rack and for removing a secured chassis from the electronics rack.

More specifically, in one aspect of the present invention, a chassis retaining system for an electronics rack includes a handle and a securing device with a retaining surface. The securing device is coupled to the handle, and the retaining surface is movable with respect to the handle. The chassis retaining system further includes a user interface device coupled to the handle and to the securing device. The user interface device is movable with respect to the handle. The user interface device engageable by a user to move the retaining surface from a first position with respect to the handle wherein a surface of the electronics rack in which a chassis is mounted retains the retaining surface, to a second position wherein the surface of the electronics rack does not retain the retaining surface.

In another aspect of the invention, an apparatus for housing electronic equipment includes a chassis supporting the electronic equipment and a rack. The chassis is mounted in the rack. The chassis is moveable with respect to the rack. The rack has a first surface. The apparatus further includes a handle fixably coupled to the chassis and a securing device with a retaining surface. The securing device is coupled to the handle. The retaining surface is movable with respect to the handle. The apparatus further includes a user interface device coupled to the handle and to the securing device. The user interface device is movable with respect to the handle. The user interface device is engageable by a user to move the retaining surface from a first position with respect to the handle wherein the first surface of the rack retains the retaining surface to secure the chassis to the rack in a secured position with respect to the rack, to a second position wherein the first surface does not retain the retaining surface.

In another aspect of the invention, a computer system includes a processor, a memory electrically coupled to the processor, a chassis supporting the processor and the memory, and a rack. The chassis is mounted in the rack. The chassis is moveable with respect to the rack. The rack has a first surface. The computer system also includes a handle fixably coupled to the chassis and a securing device with a retaining surface. The securing device is coupled to the handle. The retaining surface is movable with respect to the handle. The computer system further includes a user interface device coupled to the handle and to the securing device. The user interface device is movable with respect to the handle. The user interface device is engageable by a user to move the retaining surface from a first position with respect to the handle wherein the first surface of the rack retains the retaining surface to secure the chassis to the rack in a secured position with respect to the rack, to a second position wherein the first surface does not retain the retaining surface.

The present invention eliminates the need for chassis securing devices such as thumb screws, machine screws, or latching slides.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of the best contemplated mode for carrying out the invention. The description is intended to be illustrative of the invention and should not be taken to be limiting.

Figure 1:
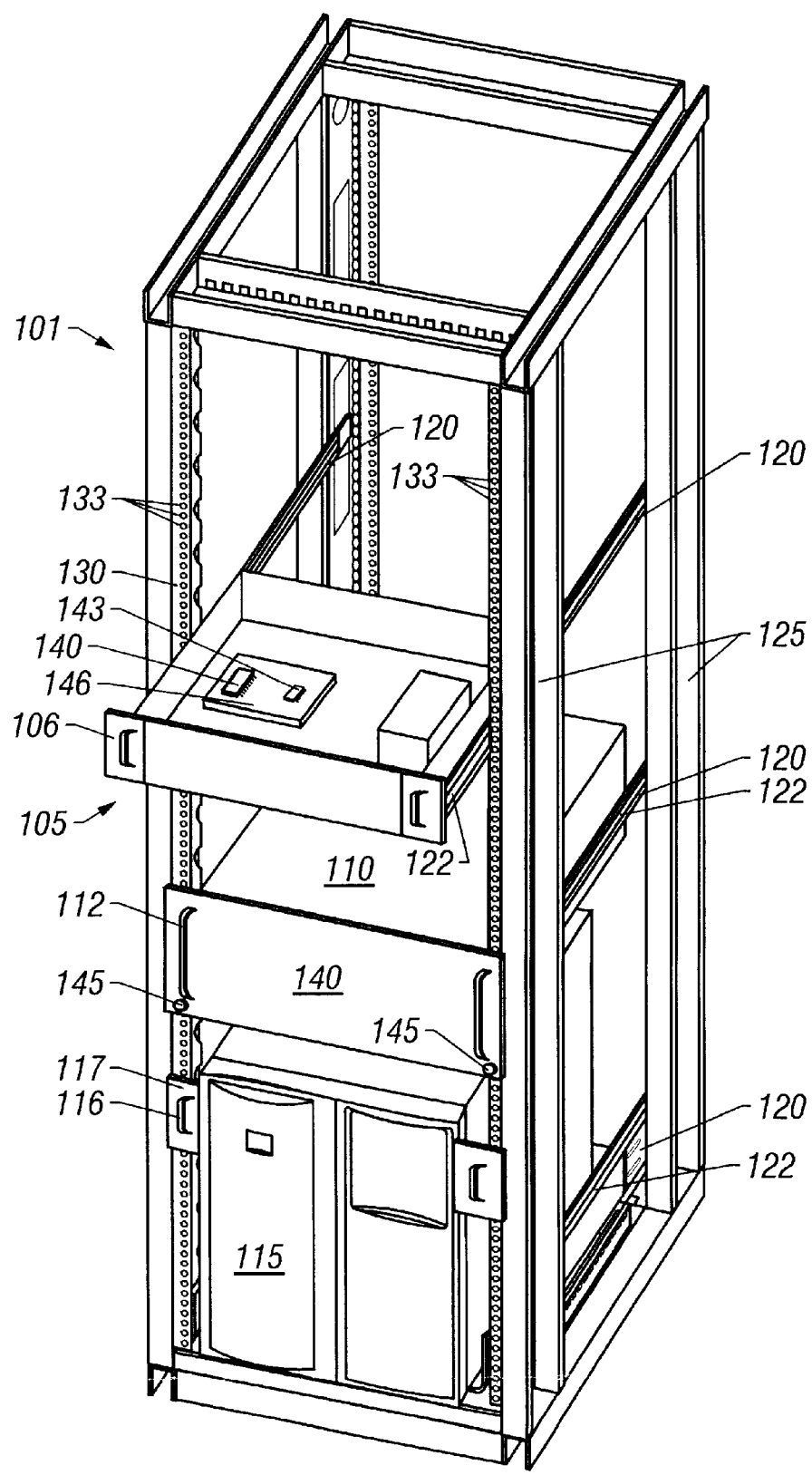
FIG. 1 is a perspective view of an electronics rack with chassis containing electronics equipment.

FIG. 1 shows a perspective view of an electronics rack that includes chassis for housing and supporting electronic equipment such as computer systems. In the embodiment shown, the rack and chassis conform to the EIA standard. The rack 101 includes vertical side rails 125 that provide vertical support to the rack. Attached to these vertical rails 125 are vertical members 130 that include square perforations 133 used for securing the chassis to the electronics rack 101. Chassis 105, 110, and 115 support electronic equipment such as computer systems in the rack. These chassis may fully enclose the electronics equipment, such as chassis 115 and 110, or partially enclose electronics equipment, such as chassis 105. These chassis are mounted in the electronics rack 101 by chassis rails 122 attached to the chassis and rack rails 120 attached to the rack. These sliding rails 120 and 122 allow a chassis to be inserted into the rack 101 and slid into a secured position in the rack such as the positions shown for chassis 110 and 115. The chassis 105, 110, and 115 each have handles 106, 112, and 116, respectively, attached directly to the chassis or fixably coupled to the chassis via a device such as a rack wing 117. The handles allow a user to move the chassis in and out on the sliding rails 120 and 122. Handles 112 are attached to the front panel 140 of chassis 110. Handles 116 are attached to rack wings 117 which are attached to chassis 115. FIG. 1 shows the handles 106, 112, and 116 attached in a vertical orientation. In other embodiments, the handles may be attached in other orientations such as in a horizontal orientation.

The electronics equipment supported by chassis 105 includes a computer system that has a processor 140 and a memory 143 electrically coupled to the processor on a printed circuit board 146. Electronics rack 101 may include a variety of electronics equipment including different types of computer systems or it may house a single computer system.

Figure 2:
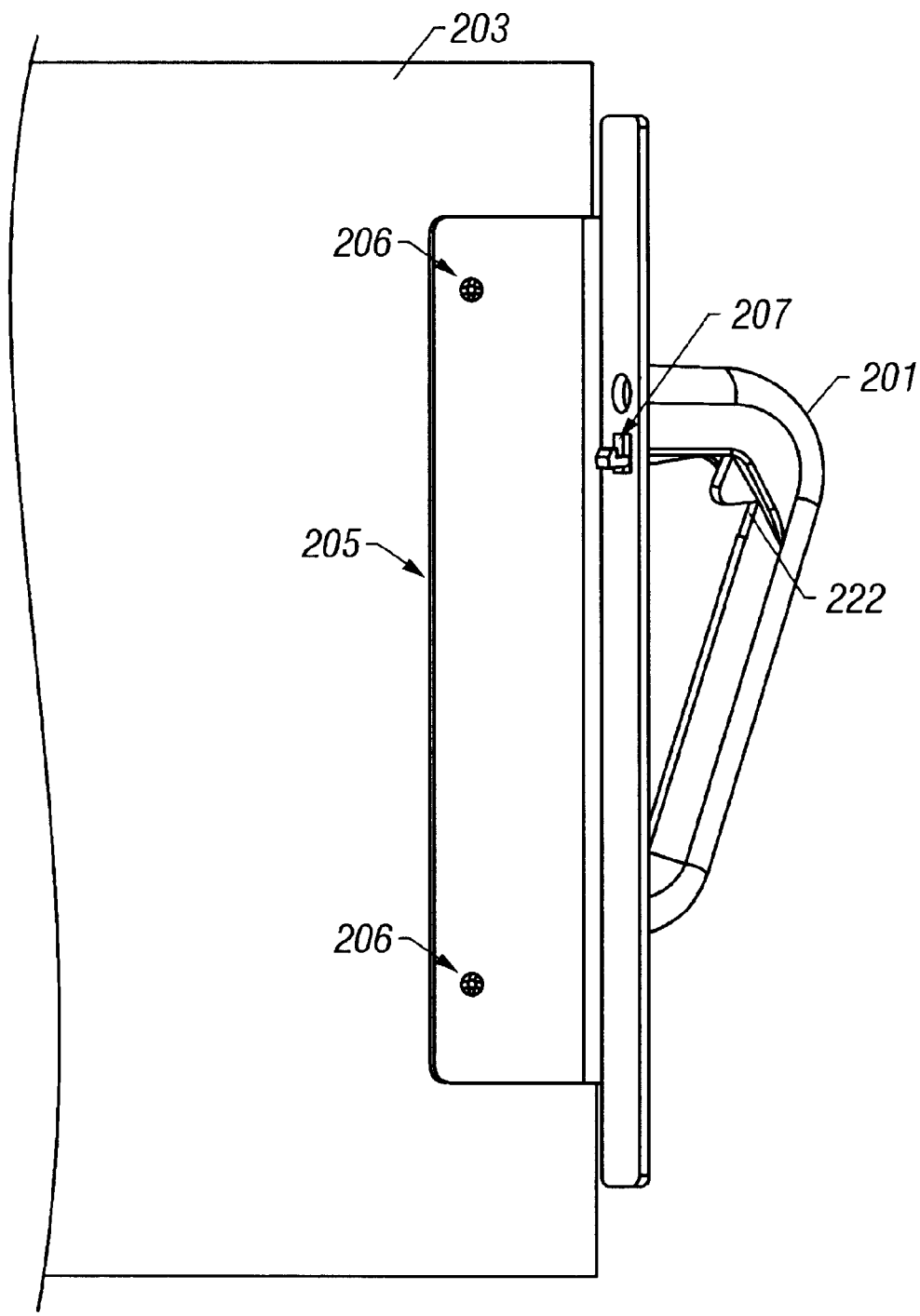
FIG. 2 is a side view of an embodiment of a chassis retaining system according to the present invention.

FIG. 2 is a side view of one embodiment of a chassis retaining system. Handle 201 is attached to a rack wing 205 which is attached with rivets 206 to the chassis 203. Coupled to the handle is a securing device 207. In the embodiment shown, securing device 207 is a snap hook or catch. The handle is also coupled to a user interface device 222 for moving the securing device 207 with respect to the handle 201. In the embodiment shown, the user interface device 222 is a trigger release connected to the securing device 207 inside the handle. In the embodiment shown, the securing device 207 extends out from the underneath side of handle 201.

Figure 3:
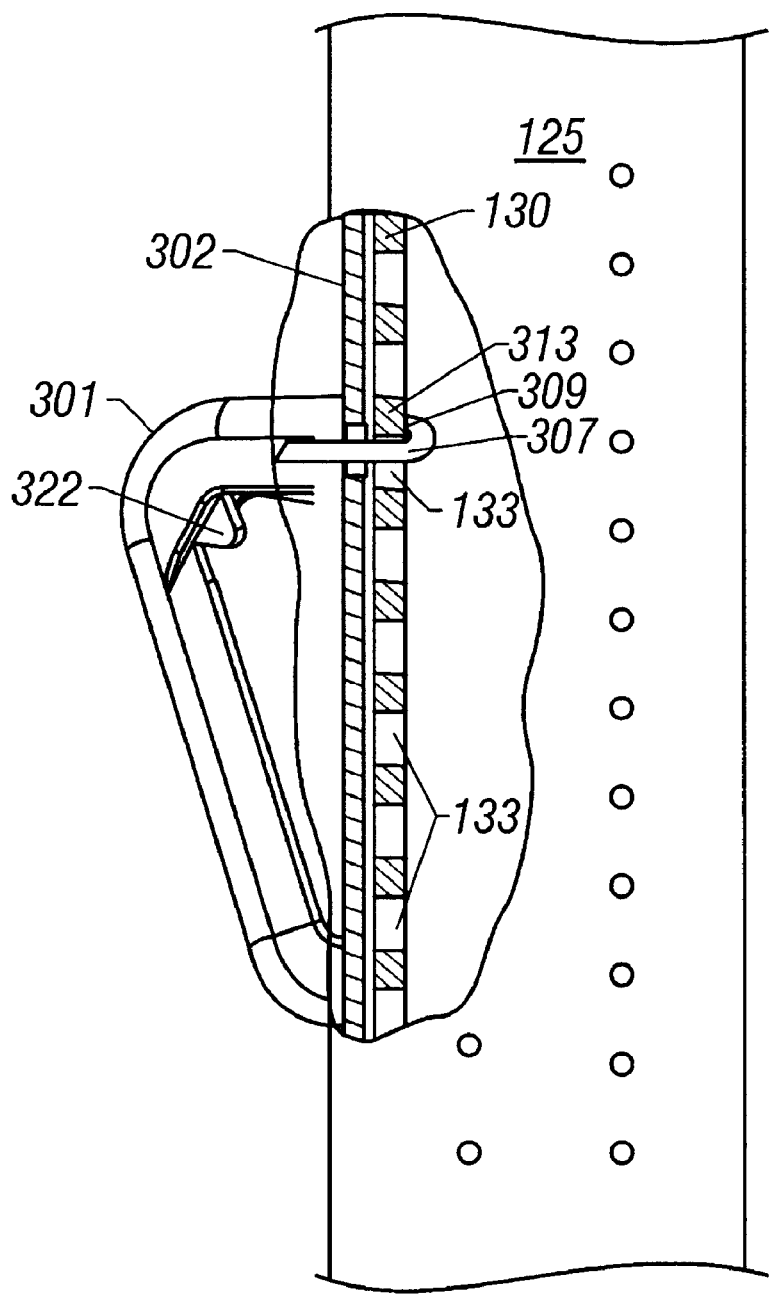
FIG. 3 is a partially cut-away side view of an embodiment of a chassis retaining system according to the present invention.

FIG. 3 shows a partially cut-away side view of another embodiment of the present invention. In FIG. 3, handle 301 is attached to the front panel 302 of a chassis that is secured to the electronics rack 101. Trigger release 322 and securing device 307 are coupled to the handle 301. The securing device 307, in the embodiment shown, is a snap hook or catch that has a retaining surface 309. This retaining surface is retained by the back side 313 of the vertical member 130. The securing device 307 extends through rectangular perforation 133 of vertical member 130. Because handle 301 is attached to the chassis front panel 302 and because the securing device 307 is coupled to the handle 301, the back surface 313 of vertical member 130 retaining the securing device 307 secures the chassis to the electronics rack 101.

Figure 4:
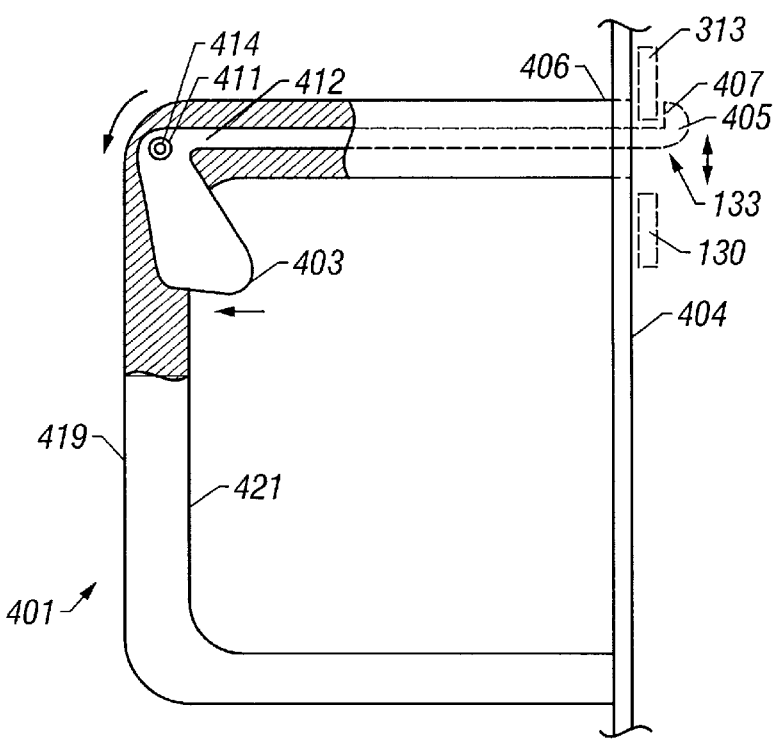
FIG. 4 is a partially cut-away and phantom side view of an embodiment of the chassis retaining system according to the present invention.

FIG. 4 shows a partially cut-away and phantom side view of another embodiment of the present invention. In FIG. 4, handle 401 is attached to the front panel of a chassis 404, or in alternative, to a rack wing. The securing device 405 and the user interface device 403 are connected to a rotating body 412 that is mounted on a pivot 411 attached to the inside of handle 401. A rotary spring 414 is attached to the rotating body 412 and the pivot 411 and provides a counter clockwise force upon the rotating body 412, relative to the view shown in FIG. 4. Securing device 405 extends from the rotating body 412 in the hollow handle 401 and through an opening 406 in the front panel 404 shown in phantom. The securing device 405 has a retaining surface 407. The rotating body 412 rotates on pivot 411 allowing the retaining surface 407 to move in an upward and downward direction, relative to the view shown in FIG. 4. Spring 414 provides a force that moves retaining surface 407 upward, relative to the view in FIG. 4. The user pressing the trigger release 403 rotates the rotating body 412 in a clockwise direction, relative to the view shown in FIG. 4, causing the securing device 405, and more specifically the retaining surface 407, to move downward to a position wherein the back surface 313 of vertical member 130 no longer retains the retaining surface 407. With the retaining surface 407 in this position, the chassis is no longer secure to the vertical member 130 of rack 101. The user can then remove the chassis by pulling handle 401 to the left, relative to the view shown in FIG. 7. By simultaneously engaging the trigger release 403 and pulling the handle 401, the head portion of retaining device 405 can be pulled through perforation 133.

Figure 5:
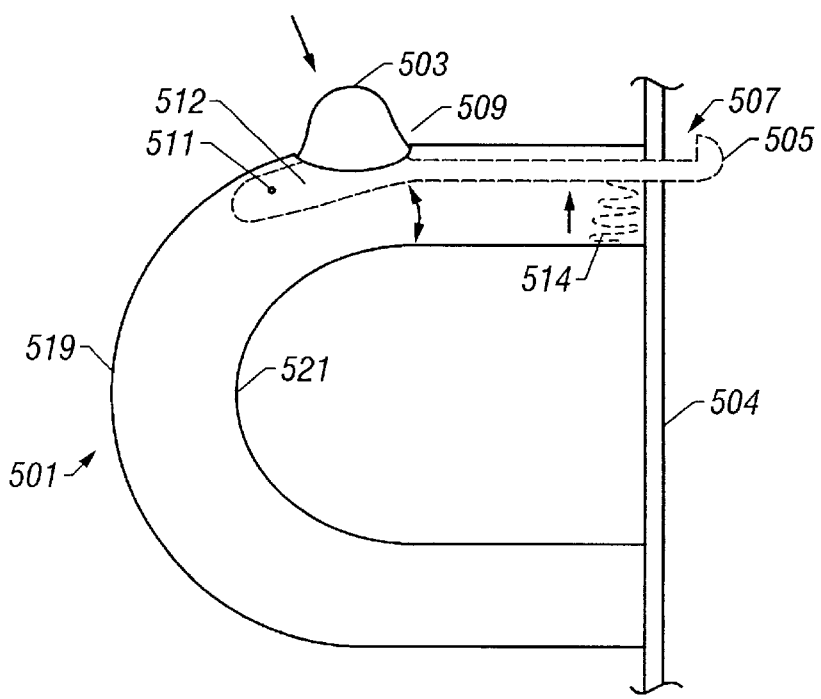
FIG. 5 is a partially phantom side view of an embodiment of the chassis retaining system according to the present invention.

FIG. 5 shows a partially phantom side view of another embodiment of the present invention. In this embodiment, the user interface device 503 is located on the outer side 519 of handle 501. The outer side 519 is a side of handle 501 that generally faces the user as opposed to the inner side 521 of handle 501. Referring again to FIG. 4, the user interface device 403 is accessible to the user on the inner side 421 of handle 401. These inner sides 421 and 521 generally face the chassis and generally face away from the user. The user interface device 503 is accessible through a hole 509 in the top portion of the handle 501. The user interface device 503 is connected to a rotating body 512 which is enclosed within the hollow handle 501. This rotating body 512 is mounted on a pivot 511 which is attached to the inner side of the handle 501. A securing device 505 is also connected to the rotating body 512. A push spring 514, shown in phantom, is attached to securing device 505 at a location inside the hollow handle 501. Push spring 514 provides a force upward, relative to the view shown in FIG. 5, that moves the securing device 505 in an upward direction. The user pushing down on the user interface device 503 causes the securing device 505 to move in a downward direction, relative to the view shown in FIG. 5, which moves the retaining surface 507 to a position where the back side 313 of vertical member 130 (see FIG. 1) no longer retains the retaining surface 507.

Figure 6:
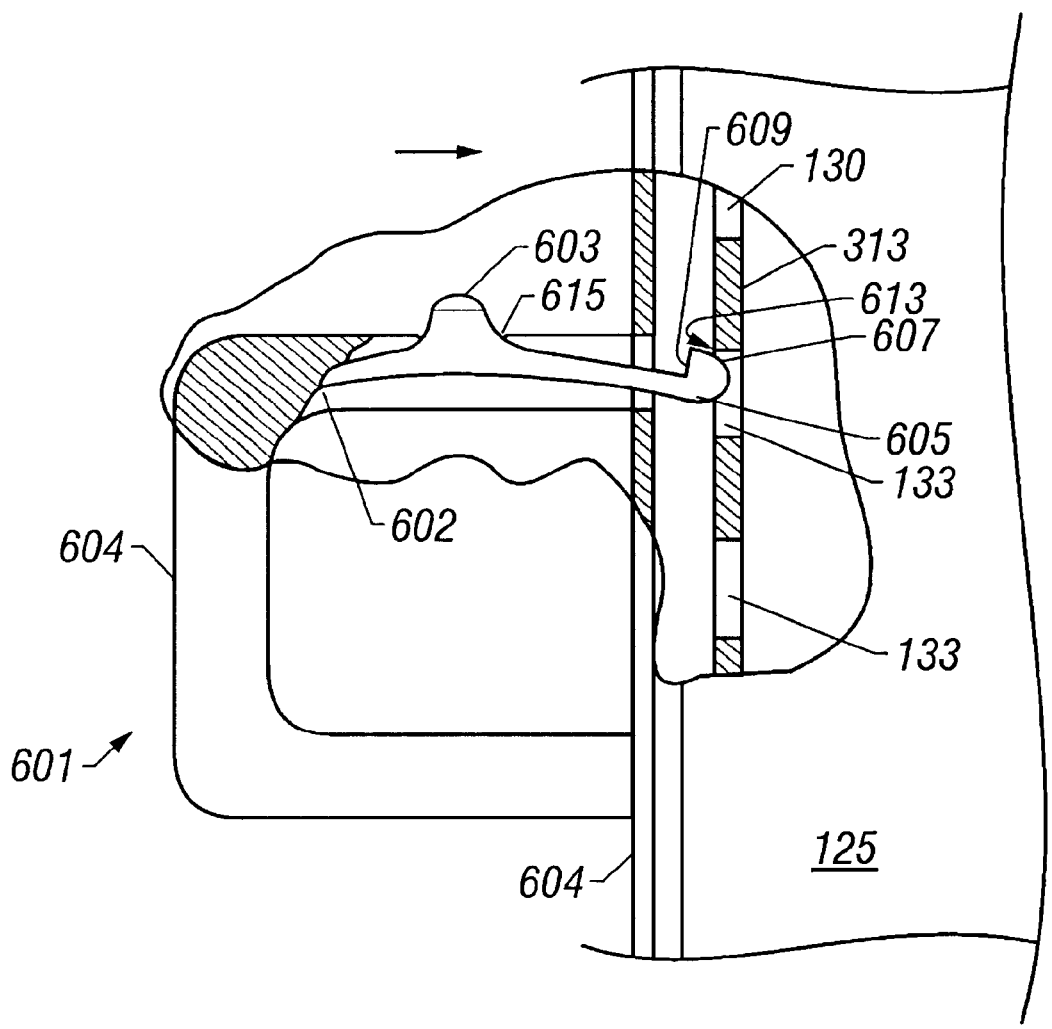
FIG. 6 is a partially cut-away side view of an embodiment of the chassis retaining system according to the present invention.

FIG. 6 shows a partially cut away side view of another embodiment of the chassis retaining system. A user interface device 603 is accessible to the user from a side 604 of handle 601 that generally faces the user. This user interface device 603 protrudes through an opening 615 on the top portion of handle 601. The securing device 605 is connected to the user interface device 603 and is attached to a solid portion 602 of the handle 601. In this embodiment, the securing device 605 is made of a flexible or springy material that allows the securing device 605 to move in an upward and downward direction, relative to the view shown in FIG. 6. The securing device 605 has a head portion 607 with a shape that causes the securing device 605 to be moved in a downward direction, relative to the view shown in FIG. 6, when the chassis is being inserted in the rack as shown in FIG. 6. The head portion 607 has a curved shape that as soon as it comes into contact with surface 613 of the vertical member 130, surface 613 forces securing device 605 in a downward direction to a position where the head portion 607 of securing device 605 will penetrate perforation 133 as the chassis is being pushed in a direction to the right, relative to the view shown in FIG. 6. As the chassis is pushed further to the right, the head portion 607 clears perforation 133. The securing device 605 is pre-loaded or biased to move in an upward direction from its position shown in FIG. 6. When the head portion 607 of securing device 605 clears the perforation 133 during insertion, securing device 605 moves in an upward direction, relative to the view shown in FIG. 6, to a position where surface 313 retains the retaining surface 609 of securing device 605. To remove the chassis in FIG. 6 from the rack, the user presses downward on user interface device 603 which forces the securing device 605 to move in a downward direction to where retaining surface 609 clears the backside surface 313. At this time, head portion 607 of securing device 605 can be moved through perforation 133, and the chassis can be slid out from rack 101.

Referring again to FIG. 1, the chassis 105, 110, and 115 each have two handles. In some embodiments, each of the two handles may include a securing device and a user interface device. In other embodiments, only one handle per chassis may include a securing device and a user interface device.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A chassis retaining system for an electronics rack comprising:
   a handle;
   a securing device with a retaining surface, the securing device coupled to the handle, the retaining surface movable with respect to the handle; and
   a user interface device coupled to the handle and to the securing device, the user interface device movable with respect to the handle, the user interface device engageable by a user to move the retaining surface from a first position with respect to the handle wherein a surface of the electronics rack in which a chassis is mounted retains the retaining surface, to a second position wherein the surface of the electronics rack does not retain the retaining surface. wherein the user interface device is connected to a rotating, body, the rotating body mounted on a pivot attached to the handle, a user engaging the user interface device to rotate the rotating body on the pivot in a first direction to move the retaining surface from the first position to the second position.

2. The chassis retaining system of claim 1 further comprising:
   a spring providing a force to rotate the rotating body in a second direction, the second direction being in an opposite direction of the first direction.

3. The chassis retaining system of claim 3 wherein:
   the spring is a rotary type of spring.

4. The chassis retaining system of claim 1 wherein:
   the rotating body is substantially located within the handle; and
   the user interface device being accessible to the user from outside the handle.

5. The chassis retaining system of claim 1 wherein:
   the handle having a side generally facing away from the rack and a side generally facing the rack;
   the user interface device being accessible to the user from outside the handle; and
   user interface device being accessible to the user from the side generally facing the rack.

6. The chassis retaining system of claim 1 wherein:
   the handle having a side generally facing away from the rack and a side generally facing the rack;
   the user interface device being accessible to the user from outside the handle; and
   user interface device being accessible to the user from the side generally facing away from the rack.

7. The chassis retaining system of claim 1 wherein the securing device is a hook snap.

8. The chassis retaining system of claim 1 wherein:
   the securing device having a head portion of a first shape;
   when the chassis is being moved towards a secured position in the rack, the head portion contacts a structure of the rack when the chassis is in a first chassis position with respect to the rack; and
   as the chassis is moved further towards the secured position from the first chassis position, the first shape of the first head allowing the structure to move the head portion so that the chassis may be moved to the secured position.

9. The chassis retaining system of claim 1 further comprising:
   a rack wing attached to the handle, the rack wing for attaching to the chassis.

10. The chassis retaining system of claim 1 wherein:
    the handle being attached to a front panel of the chassis.

11. The chassis retaining system of claim 1 further comprising:
    a spring providing a force to move the retaining surface from the second position to the first position.

12. The chassis retaining system of claim 1 wherein:
    the user interface device is a trigger release.

13. A chassis retaining system for an electronics rack comprising:
    a handle;
    a securing device with a retaining surface, the securing device coupled to the handle, the retaining surface movable with respect to the handle;
    a user interface device coupled to the handle and to the securing device, the user interface device movable with respect to the handle, the user interface device engageable by a user to move the retaining surface from a first position with respect to the handle wherein a surface of the electronics rack in which a chassis is mounted retains the retaining surface, to a second position wherein the surface of the electronics rack does not retain the retaining surface;
    a second handle;
    a second securing device with a retaining surface, the second securing device coupled to the second handle, the retaining surface movable with respect to the second handle; and
    a second user interface device coupled to the second handle and to the second securing device, the second user interface device movable with respect to the second handle, the second user interface device engageable by the user to move the retaining surface from a first position with respect to the handle wherein a second surface of the electronics rack retains the retaining surface of the second securing device, to a second position wherein the second surface of the electronics rack does not retain the retaining surface of the second securing device.

14. An apparatus for housing electronic equipment comprising:
a chassis supporting the electronic equipment;
a rack, the chassis mounted in the rack, the chassis moveable with respect to the rack, the rack having a first surface;
a handle fixably coupled to the chassis;
a securing device with a retaining surface, the securing device coupled to the handle, the retaining surface movable with respect to the handle; and
a user interface device coupled to the handle and to the securing device, the user interface device movable with respect to the handle, the user interface device engageable by a user to move the retaining surface from a first position with respect to the handle wherein the first surface of the rack retains the retaining surface to secure the chassis to the rack in a secured position with respect to the rack, to a second position wherein the first surface does not retain the retaining surface wherein the user interface device is connected to a rotating body, the rotating body mounted on a pivot attached to the handle, a user engaging the user interface device to rotate the rotating body on the pivot in a first direction to move the retaining surface from the first position to the second position.

15. The apparatus of claim 14 wherein:
the rack and the chassis are compatible to a standard set by the Electronic Industries Association relating to rack design.

16. The apparatus of claim 14 further comprising:
a spring providing a force to move the retaining surface from the second position to the first position.

17. The apparatus of claim 14 wherein:
the securing device having a head portion of a first shape;
when the chassis is being moved towards a secured position in the rack, the head portion contacts a structure of the rack when the chassis is in a first chassis position with respect to the rack; and
as the chassis is moved further towards the secured position from the first chassis position, the first shape of the first head allowing the structure to move the head portion so that the chassis may be moved to the secured position.

18. A computer system comprising:
a processor;
a memory electrically coupled to the processor;
a chassis supporting the processor and the memory;
a rack, the chassis mounted in the rack, the chassis moveable with respect to the rack, the rack having a first surface;
a handle fixably coupled to the chassis;
a securing device with a retaining surface, the securing device coupled to the handle, the retaining surface movable with respect to the handle; and
a user interface device coupled to-the handle and to the securing device, the user interface device movable with respect to the handle, the user interface device engageable by a user to move the retaining surface from a first position with respect to the handle wherein the first surface of the rack retains the retaining surface to secure the chassis to the rack in a secured position with respect to the rack, to a second position wherein the first surface does not retain the retaining surface wherein the user interface device is connected to a rotating body, the rotating body mounted on a pivot attached to the handle, a user engaging the user interface device to rotate the rotating body on the pivot in a first direction to move the retaining surface from the first position to the second position.

19. A computer system of claim 18 further comprising:
a second handle fixably coupled to the chassis;
a second securing device with a retaining surface, the second securing device coupled to the second handle, the second retaining surface movable with respect to the second handle; and
a second user interface device coupled to the second handle and to the second securing device, the second user interface device movable with respect to the second handle, the second user interface device engageable by a user to move the retaining surface of the second securing device from a first position with respect to the second handle wherein the second surface of the rack retains the retaining surface of the second securing device to secure the chassis to the rack in the secured position with respect to the rack, to a second position wherein the second surface does not retain the retaining surface of the second securing device.

20. The computer system of claim 18 further comprising:
a spring providing a force to rotate the rotating body in a second direction, the second direction being in an opposite direction of the first direction.

21. A chassis retaining system for an electronics rack comprising:
a handle;
a securing device with a retaining surface, the securing device coupled to the handle, the retaining surface movable with respect to the handle; and
a user interface device coupled to the handle at a location encompassed by handle, the user interface device movable with respect to the handle, the user interface device engageable by a user to move the retaining surface from a first position with respect to the handle wherein a surface of the electronics rack in which a chassis is mounted retains the retaining surface, to a second position wherein the surface of the electronics rack does not retain the retaining surface.

22. The chassis retaining system for an electronics rack as recited in claim 21 wherein the securing device is coupled to the handle at a location within the handle.

23. The chassis retaining system for an electronics rack as recited in claim 21 wherein the securing device is fixably coupled to the user interface.

24. The chassis retaining system for an electronics rack as recited in claim 23 wherein the securing device is fixably coupled to the user interface at a location within the handle.

25. The chassis retaining system of claim 21 wherein:
the handle having a side generally facing away from the rack and a side generally facing the rack;
the user interface device being accessible to the user from outside the handle; and
user interface device being accessible to the user from the side generally facing the rack.

26. The chassis retaining system of claim 21 wherein:
the handle having a side generally facing away from the rack and a side generally facing the rack;
the user interface device being accessible to the user from outside the handle; and
user interface device being accessible to the user from the side generally facing away from the rack.

27. The chassis retaining system of claim 21 wherein the securing device is a hook snap.

28. The chassis retaining system of claim 21 further comprising:

a second handle;

a second securing device with a retaining surface, the second securing device coupled to the second handle, the retaining surface movable with respect to the second handle; and a second user interface device coupled to the second handle and to the second securing device, the second user interface device movable with respect to the second handle, the second user interface device engageable by the user to move the retaining surface from a first position with respect to the handle wherein a second surface of the electronics rack retains the retaining surface of the second securing device, to a second position wherein the second surface of the electronics rack does not retain the retaining surface of the second securing device.

* * * * *